United States Patent
Holesinger et al.

(10) Patent No.: US 6,451,742 B1
(45) Date of Patent: Sep. 17, 2002

(54) HIGH TEMPERATURE SUPERCONDUCTING COMPOSITE CONDUCTOR AND METHOD FOR MANUFACTURING THE SAME

(75) Inventors: Terry G. Holesinger, Los Alamos; John F. Bingert, Jemez Springs, both of NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/587,676

(22) Filed: Jun. 5, 2000

Related U.S. Application Data

(60) Provisional application No. 60/138,326, filed on Jun. 9, 1999.

(51) Int. Cl.[7] .......................... H01B 12/00; H01L 39/12; H01L 39/24
(52) U.S. Cl. .................... 505/433; 505/739; 174/125.1; 29/599
(58) Field of Search .................... 505/433, 236, 505/237, 739; 29/599; 174/125.1

(56) References Cited

U.S. PATENT DOCUMENTS

| | | | | |
|---|---|---|---|---|
| 5,232,908 A | * | 8/1993 | Shiga et al. | 505/1 |
| 5,661,113 A | * | 8/1997 | Danyluk et al. | 425/335 |
| 5,849,670 A | * | 12/1998 | Nabatame et al. | 12/230 |
| 5,908,812 A | * | 6/1999 | Cotton et al. | 505/230 |
| 6,240,619 B1 | * | 6/2001 | Balachandran et al. | 29/599 |
| 6,272,731 B1 | * | 8/2001 | Leriche et al. | 29/599 |

* cited by examiner

*Primary Examiner*—Mark Kopec
(74) *Attorney, Agent, or Firm*—Bruce H. Cottrell

(57) ABSTRACT

A high temperature superconducting composite conductor is provided including a high temperature superconducting material surrounded by a noble metal layer, the high temperature superconducting composite conductor characterized as having a fill factor of greater than about 40. Additionally, the conductor can be further characterized as containing multiple cores of high temperature superconducting material surrounded by a noble metal layer, said multiple cores characterized as having substantially uniform geometry in the cross-sectional dimensions. Processes of forming such a high temperature superconducting composite conductor are also provided.

9 Claims, 1 Drawing Sheet

HIGH TEMPERATURE SUPERCONDUCTING COMPOSITE CONDUCTOR AND METHOD FOR MANUFACTURING THE SAME

This application claims the benefit of U.S. Provisional Application No. 60/138,326, filed Jun. 9, 1999.

This invention is the result of a contract with the Department of Energy (Contract No. W-7405-ENG-36).

FIELD OF THE INVENTION

The present invention relates to a high temperature superconducting composite conductor and to a process for the manufacture of such a high temperature superconducting composite conductor.

BACKGROUND OF THE INVENTION

The discovery of high temperature superconductive materials in the late 1980's was soon followed by a desire to form such materials into tapes or similar shapes. Ideally such tapes should be physically strong, flexible, highly conductive and able to withstand strong magnetic fields without loss of current carrying capacity.

Processes generally referred to as "oxide powder in a tube" (OPIT) have been developed. For example, a general process of fabricating superconductive tape involves initially preparing a superconductive powder, filling a tube or pipe of silver with the superconductive powder, sealing the pipe or tube, subjecting the pipe or tube to reducing or deforming operations to form tape, and finally sintering the reduced tape at high temperatures. Such reducing or deforming operations have typically included both a drawing stage and a rolling stage.

OPIT processes have several problem areas hindering their industrial application. First, silver is a major cost in the production of bismuth-based superconducting tapes for commercial applications. Current methods for reducing costs of bismuth-based conductors are limited due to a need for a wire drawing step in the production of the conducting tapes. Wire drawing results in a typical fill factor for the superconductor within the tapes to a limit of only about 30 percent by volume. This limitation results from the inability of the powder core to supply enough support during wire drawing due to lack of tensile strength. Hence, a significant amount of silver is needed for the wire to survive the drawing process.

Another drawback is the uniformity of the filaments after wire drawing and rolling. Rolling is nominally a plane-strain process. However, the process of rolling a round wire leads to a non-uniform distribution of stresses and strains within the wire as it is flattened and elongated. Hence, in a multifilamentary product, non-uniformity of the different filaments is a common problem. The outside filaments are often more porous and less uniform than interior filaments. Often, there are also many filament interconnections within the tapes. By "interconnections" is meant that during the rolling process, the deformation of the silver/superconducting powder composite leads to two or more filaments combining or touching. This is a problem as these filament interconnects tend to have more secondary phases and porosity which leads to breakdown in the connectivity of the superconductor and to lower critical currents.

Another known process of forming high temperature superconductor tapes is referred to as continuous tube forming and filling. Such a process involves taking a silver strip and then placing superconductive precursor powder onto the silver strip as it is continuously formed into a tube in a process like the welding industry has used to make tubular welding wire. However, the reported fill factor on this process is only about 25 percent.

As a result of persistant studies, the inventors have found a process to overcome these drawbacks and to produce a product without these limitations.

Accordingly, it is an object of the present invention to provide a high temperature superconducting composite conductor having a low silver content and a high fill factor of superconductive material.

It is another object of the present invention to provide a high temperature multifilamentary superconducting composite conductor wherein the multiple filaments are substantially uniform in shape and/or dimensions.

It is a further object of the invention to provide a process of preparing a high temperature superconducting composite conductor having a low silver content and a high fill factor of superconductive material.

It is still another object of the invention to provide a process of preparing a high temperature multifilamentary superconducting composite conductor wherein the multiple filaments are substantially uniform in shape and/or dimensions.

Still another object of the invention is to achieve plane-strain deformation to obtain optimally densified cores.

SUMMARY OF THE INVENTION

To achieve the foregoing and other objects, and in accordance with the purposes of the present invention, as embodied and broadly described herein, the present invention provides a process of preparing a high temperature superconducting composite conductor including filling rectangular-shaped tube of a noble metal with an oxide superconductor mixture; placing the filled rectangular-shaped noble metal tube into a secondary metal matrix containing a opening adapted for insertion of the filled rectangular-shaped noble metal tube; and, rolling the secondary metal matrix containing the filled rectangular-shaped noble metal tube to form a rolled product of a preselected thickness. The process can further include heating said rolled product at temperatures and for time sufficient to form a high temperature superconducting composite conductor.

The present invention further provides a process of preparing a high temperature superconducting composite conductor including filling rectangular-shaped tube of a noble metal with an oxide superconductor mixture; and, rolling said filled rectangular-shaped noble metal tube to form a rolled product of a preselected thickness. The process can further include heating said rolled product at temperatures and for time sufficient to form a high temperature superconducting composite conductor.

The present invention further provides a high temperature superconducting composite conductor including a high temperature superconducting material surrounded by a noble metal layer, the high temperature superconducting composite conductor characterized as having a fill factor of greater than about 40 percent. In one embodiment of the invention the conductor can be further characterized as containing multiple cores of high temperature superconducting material surrounded by a noble metal layer, said multiple cores characterized as having substantially uniform geometry in the cross-sectional dimensions.

The present invention still further provides a high temperature superconducting composite conductor prepared by the above process.

DETAILED DESCRIPTION

The present invention is concerned with a process of preparing a high temperature superconducting composite conductor, such a process involving rolling only. The present invention is further concerned with the high temperature superconducting composite conductor prepared by the rolling process.

In one embodiment of the present invention, rectangular tubes of a noble metal are filled with the superconductive powder and the filled rectangular tubes are fitted into a secondary metal matrix such as copper for support and for achieving plane-strain deformation. This structure is then rolled down to a flat tape without any intermediate wire drawing stage. A multifilamentary composite can be formed by stacking a multiple of filled rectangular tubes within the secondary metal matrix and rolling the stack down to the desired thickness. After final rolling the secondary metal matrix is separated from the flattened filled rectangular tubes.

Figure 2:
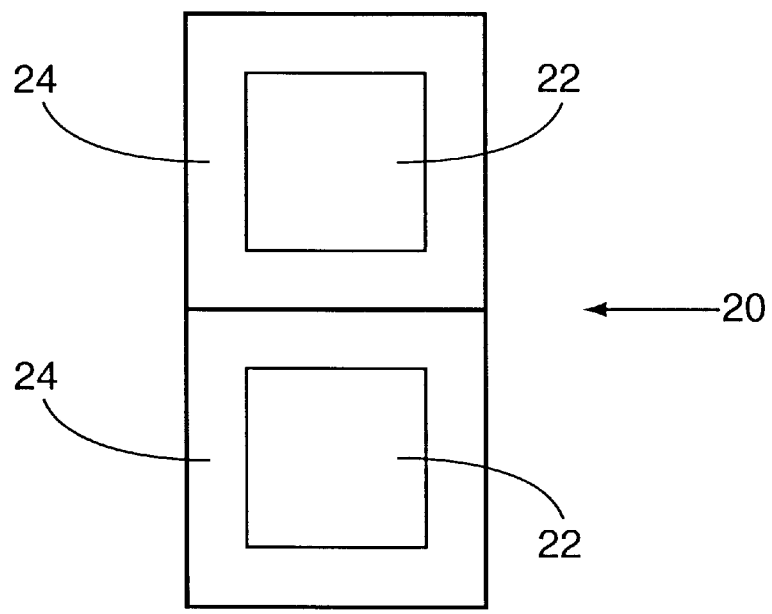
FIG. 2 shows a schematic diagram of a cross section of a multiple stacked precursor system for a multifilament high temperature superconducting composite conductor in accordance with the present invention.

In another embodiment of the present invention, rectangular tubes of a noble metal are filled with the superconductive powder and the filled rectangular tubes are rolled down to a flat tape without any intermediate wire drawing stage. A multifilamentary composite can be formed by stacking a multiple of filled rectangular tubes together as seen in FIG. 2 and rolling the stacked tubes down in size to the desired thickness.

The noble metal tubes employed in the present invention can be rectangular or square in shape. Other non-cylindrical shapes such as, e.g., parallelograms or trapezoids, may be used but are generally less desirable as they may result in less uniform filaments due to different strain paths during rolling or reduction.

Figure 1:
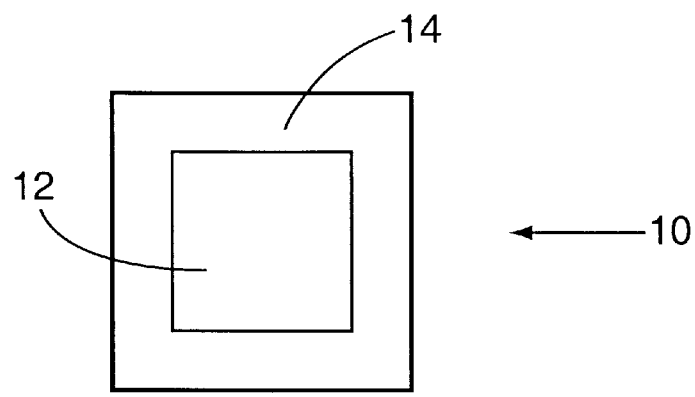
FIG. 1 shows a schematic diagram of a cross section of an embodiment of a precursor article for a high temperature superconducting composite conductor of the present invention.

FIG. 1 shows article 10, i.e., a rectangular-shaped tube 14 of a noble metal filled with superconductive precursor powder 12. FIG. 2 shows a stack 20 of two such rectangular-shaped tubes where the two rectangular-shaped tubes 24 are filled with superconductive precursor powder 22.

The present invention can be practiced with any desired superconductive material preferably one of the superconducting oxides. Members of the bismuth family, and particularly its 2212 phase ($Bi_2Sr_2Ca_1Cu_2O_x$) and 2223 phase ($Bi_2Sr_2Ca_2Cu_3O_{10}$) are especially preferred. BSCCO compounds containing lead such as $(Bi,Pb)_2Sr_2Ca_2Cu_3O_{10}$) can also be employed. In addition other superconductive materials such as members of the yttrium rare earth family, and particularly the various 123, 124 and 247 phases may be used.

The superconductive material is encased in a noble metal matrix. The noble metal matrix is non-reactive with the superconductive material. Although silver is preferred as the noble metal, other metals exhibiting similar mechanical, chemical and electrical properties may be used, e.g., alloys of silver such as silver/gold, oxide dispersion strengthened (ODS) silver, and other noble metals.

Fill factor is the ratio of the area of the superconductive material to the overall area of the tape in a vertical cross-section of the tape as determined after densification of the core. By measuring the area at various cross-sections and determining an average area, a fill factor reported as a percent by volume can be calculated. In the process of the present invention, the resultant product can have fill factors of greater than about 40 percent by volume, and preferably fill factors of greater than about 50 percent by volume. Fill factors of as great as about 67 percent by volume or greater may be achieved by this process.

By the process of the present invention, less silver is needed to encase the superconductive material due to the elimination of any drawing steps in the reduction to the final tape. In addition, more uniformity within the superconductive filaments of the composite is expected, as the stresses from the rolling process would be uniformly distributed across the composite. Hence, all portions of each filament and all filaments within the composite would experience the same strain path during reduction to form a thin, flat tape. This more uniform processing for producing tapes is expected to result in higher critical current densities. Also less $J_c$ dropoff with length is contemplated. Another benefit of the present process is in the reduction of manufacturing costs as the wire drawing stage is eliminated.

During the rolling process of the present invention, the initial width of the rolled tape does not appreciably change. Yet, the rolling only process of the present invention can allow the formation of wide filaments with substantially uniform dimensions. Superconducting filaments up to at least about 6.5 millimeters can be prepared with substantial uniformity in cross-sectional shape. Wider filaments are contemplated.

The present process includes several variations for making multifilamentary tapes. A single tube can simply be rolled to the desired tape thickness. The resulting tape could be cut and stacked within another channeled secondary matrix material for further rolling into a multifilament tape. In another approach, multiple packed tubes would be stacked into the channeled secondary matrix material as seen in FIG. 2 and a multifilamentary tape can be directly rolled in a single step. Still another approach can involve bundling tubes into multiple stacks, such as 2 by 2,3 by 3,2 by 4, etc. The bundle of tubes could then be fitted into a single outer tube, i.e., a channeled secondary matrix material, for support and rolled into a multifilamentary tape. Optionally, no channeled secondary matrix may be necessary. The size or width of the filaments can be controlled by the aspect ratio of the initial tubes. Use of a bundle of tubes may also allow for formation of the conductor followed by appropriate division of the rolled segments, e.g., by cutting or other suitable division.

The process of the present invention may also be used to roll dissimilar metals into a final resultant product. For example, rectangular-shaped metal tubes of silver may be coated with a thin layer of aluminum and the combination rolled in the manner of the present invention. A standard heat treatment to convert the superconductive precursor material to the superconducting form would then form interlayers of aluminum oxide within the resultant structure to improve sheath resistivity properties. Other dissimilar metals could be combined as well, e.g., nickel or stainless steel. Use of a dissimilar metal such as stainless steel and the like may be used to improve the mechanical properties of the composite. It is contemplated that not all sides of the rectangular tubes would be coated with the secondary metal. For example, only a single side of the rectanglar-shaped tubed may be coated with the dissimilar metal, or two, three or all sides may be coated. It is further contemplated that a single layer of a dissimilar metal may be used at the midpoint of a stack of rectangular-shaped tubes with equal numbers of rectangular-shaped tubes both below and above the dissimilar metal layer.

The present invention is more particularly described in the following examples which are intended as illustrative only, since numerous modifications and variations will be apparent to those skilled in the art.

EXAMPLE 1

Superconductive precursor powder for a final composition of $(Bi_{1.7}Pb_{0.3})Sr_{1.9}Ca_2Cu_3O_{10}$ was filled into a rectangular-shaped silver tube container including a stack of two rectangular-shaped silver tubes each having dimensions of about 0.215 inches in height (total combined height of 0.43 inches) by 0.305 inches in width. The filled silver container was placed into a groove in a copper block. The article was repeatedly rolled until the thickness was reduced to about 4 mils (0.0039 inches). The resultant tape was uniform and remained intact after processing.

The rolled tape was heat treated as follows. Initially, the tape was heated in an oven under vacuum with a flowing gas stream of 25 standard cubic centimeters (sccm) of oxygen. The temperature of the oven was gradually raised at 5° C./minute from room temperature to 500° C., held at 500° C. for one hour, gradually raised at 2° C./minute up to 725° C., held at 725° C. for five hours and then gradually cooled back to room temperature at 10° C./minute. The tape was then re-heated from room temperature to 725° C. at a gradual increase of 5° C./minute, held at 725° C. for two hours, gradually raised at 2° C./minute up to 825° C., held at 825° C. for fifty hours, gradually cooled at 1° C./minute to 800° C., held at 800° C. for five hours, and gradually cooled back to room temperature by turning off the oven.

The tape was then re-rolled to reduce the thickness down to 3.1 mils. Thereafter, an additional heating treatment was conducted as follows. The temperature of the oven was gradually raised at 10° C./minute from room temperature to 725° C., held at 725° C. for 12 minutes, gradually raised at 2° C./minute up to 840° C., held at 840° C. for two hours, gradually cooled at 1° C./minute to 825° C., held at 825° C. for fourty-five hours, gradually cooled at 0.1 ° C. to 800 °C., held at 800 C. for twenty-five hours, gradually cooled back to room temperature by turning off the oven.

After heat treatment, the resultant tape demonstrated an excellent current carrying capacity with a $J_C$ of between about 26,000 and about 28,000 amperes per square centimeter ($A/cm^2$) and an $I_C$ of about 42 A. Additonally, examination of the microstructure of the tape indicated that it had substantially uniform shaped filaments across the cross-sectional width of the tape and that individual filaments had subtantially rectangular shaped dimensions.

EXAMPLE 2

In another run, superconductive precursor powder for a final composition of $(Bi_{1.7}Pb_{0.3})Sr_{1.9}Ca_2Cu_3O_{10}$ was filled into a rectangular-shaped silver tube container including a stack of two rectangular-shaped silver tubes and repeatedly rolled. The top layer of silver was etched off and the thickness of the initail underlying superconductive material layer was measured as about 8 microns in thickness.

Although the present invention has been described with reference to specific details, it is not intended that such details should be regarded as limitations upon the scope of the invention, except as and to the extent that they are included in the accompanying claims.

What is claimed is:

1. A process of preparing a high temperature superconducting composite conductor comprising:

filling a rectangular-shaped tube of a noble metal with an oxide superconductor mixture;

placing said filled rectangular-shaped noble metal tube into a secondary metal matrix containing a opening adapted for insertion of said filled rectangular-shaped noble metal tube; and, rolling said secondary metal matrix containing said filled rectangular-shaped noble metal tube to form a rolled product of a preselected thickness without any intermediate wire drawing steps.

2. The process of claimer further including heating said rolled product at temperatures and for time sufficient to form a high temperature superconducting composite conductor.

3. The process of claim 1 wherein said rectangular-shaped noble metal tube is of silver.

4. The process of claim 1 wherein said secondary metal matrix is copper.

5. The process of claim 2 wherein said rolled product is characterized as having a fill factor of at least 40 percent by volume.

6. A process of preparing to a high temperature superconducting composite conductor comprising:

filling a rectangular-shaped tube of a noble metal with an oxide superconductor mixture; and, rolling said filled rectangular-shaped noble metal tube to form a rolled product of a preselected thickness without any intermediate wire drawing steps.

7. The process of claim 6 further including heating said rolled product at temperatures and for time sufficient to form a high temperature superconducting composite conductor.

8. The process of claim 6 wherein said rectangular-shaped noble metal tube is of silver.

9. The process of claim 6 wherein said rolled product is characterized as having a fill factor of at least 40 percent by volume.

* * * * *